(12) United States Patent
Chang (10) Patent No.: US 8,859,392 B1
(45) Date of Patent: Oct. 14, 2014

(54) MANUFACTURING METHOD OF POWER SEMICONDUCTOR

(71) Applicant: Mosel Vitelic Inc., Hsinchu (TW)

(72) Inventor: Chien-Ping Chang, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 13/974,142

(22) Filed: Aug. 23, 2013

(30) Foreign Application Priority Data

May 3, 2013 (TW) .............................. 102115822 A (51) Int. Cl.
H01L 21/30 (2006.01)
H01L 23/10 (2006.01)
H01L 29/66 (2006.01)

(52) U.S. Cl.
CPC ................................ H01L 29/66333 (2013.01)
USPC ............................ 438/455; 438/197; 438/459

(58) Field of Classification Search
CPC ...................... H01L 29/66234; H01L 27/1266; H01L 21/76254
USPC ........................... 438/455, 458, 459, 197, 234
See application file for complete search history.

(56) References Cited

U.S. PATENT DOCUMENTS 6,194,290 B1 * 2/2001 Kub et al. ...................... 438/455

* cited by examiner

*Primary Examiner* — Thanhha Pham
(74) *Attorney, Agent, or Firm* — Kirton McConkie; Evan R. Witt (57) ABSTRACT

A manufacturing method of a power semiconductor includes steps of providing a first semiconductor substrate and a second semiconductor substrate, forming a metal oxide semiconductor layer on a first surface of the first semiconductor substrate, grinding a second surface of the first semiconductor substrate, forming a N-type buffer layer and a P-type injection layer on a third surface of the second semiconductor substrate through ion implanting, grinding a fourth surface of the second semiconductor substrate, and combining the second surface of the first semiconductor substrate with the third surface of the second semiconductor substrate for forming a third semiconductor substrate. As a result, the present invention achieves the advantages of enhancing the process flexibility and un-limiting the characteristics of the power semiconductor.

11 Claims, 9 Drawing Sheets

MANUFACTURING METHOD OF POWER SEMICONDUCTOR

FIELD OF THE INVENTION

The present invention relates to a manufacturing method of a semiconductor, and more particularly to a manufacturing method of a power semiconductor using multiple wafer bonding technology.

BACKGROUND OF THE INVENTION

In recent years, with the growing of the technologies, lot types of electronic products are produced. The high-tech electronic devices are deeply combined with human's daily life. For example, each of the panels and the global positioning systems of automobiles, smart phones, tablet PCs, variety toys and remote-controlled apparatuses is part of the technology life of human nowadays. The mainly necessary elements in electronic devices are semiconductor elements, such like power semiconductors, transistors, amplifiers and switches, especially the power semiconductors are much more fabricated in industry.

For example, one of the common power semiconductors is an insulated gate bipolar transistor (hereinafter "IGBT"). The basic encapsulation of an IGBT is a power semiconductor with three terminals. The characteristics of IGBTs include high efficiency and high switching speed. Generally, IGBTs are developed to replace the bipolar junction transistors (or called BJTs). IGBTs have both the characteristics of field effect transistors (or called FET) and bipolar transistors, so the IGBTs can withstand high current load, the gate can be easily driven and the turn-on voltage drop is low. Under this circumstance, the common uses of IGBTs are applied to high-capacity power devices like switching power supplies, motor controllers and induction cookers.

Figure 1:
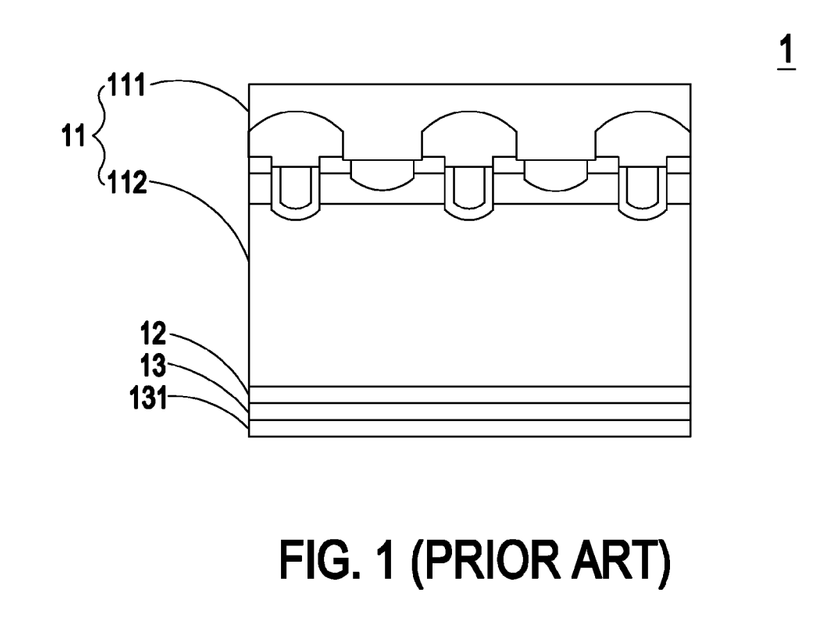
FIG. 1 schematically illustrates the structure of a conventional insulated gate bipolar transistor of the prior art.

On the other hand, even though IGBTs have been fabricated and used for tens of years, there are still some drawbacks of the process technology and semiconductor structure. Please refer to FIG. 1. FIG. 1 schematically illustrates the structure of a conventional insulated gate bipolar transistor of the prior art. A conventional trench punch-through IGBT includes a metal oxide semiconductor (or called MOS) layer 11, a N-type buffer layer 12 and a P-type injection layer 13. The MOS layer 11 is disposed between an emitter metal layer 111 and a N-type drift layer 112 for providing electron injection and controlling element switching. The N-type buffer layer 12 is used for conducting between the electrons and the electron holes and withstanding high voltage. For matching the specifications of product, a wafer backside thinning technology is used for reduce the resistance of the N-type drift layer 112, and a backside implant technology and a backside anneal technology are used for fabricating the N-type buffer layer 12 and the P-type injection layer 13 during the manufacturing process of the power semiconductor. The N-type buffer layer 12 is used for buffering the electric field and adjusting the concentration of the electron hole injection, and the P-type injection layer 13 is used for providing electron hole injection.

After the backside thinning process, the power semiconductor wafer becomes thinner so that the wafer is frangible and easy to bend. Meanwhile, since the metal process of the power semiconductor is done before the backside thinning process, the incoming anneal process is limited by the melting point of the surface metal, and the depth and the thickness of the N-type buffer layer and the P-type injection layer cannot be fabricated by the high-temperature drive-in process, in which the characteristics of power semiconductors and the process flexibility are limited everywhere.

There is a need of providing a manufacturing method of a power semiconductor to obviate the drawbacks encountered from the prior art.

SUMMARY OF THE INVENTION

The present invention provides a manufacturing method of a power semiconductor in order to eliminate the drawbacks of the phenomenon caused by thinning the wafer thickness, the limitation of the melting point of the surface metal, the low process flexibility, and the limitation of the characteristics of power semiconductors.

The present invention also provides a manufacturing method of a power semiconductor. By respectively fabricating a first semiconductor substrate and a second semiconductor substrate and forming a third semiconductor substrate by combining the first semiconductor substrate and the second semiconductor substrate, a N-type buffer layer and a P-type injection layer are formed through ion implanting and high-temperature drive-in diffusion, which are not limited by the melting point of the metal. As a result, the process flexibility is enhanced, and the characteristics of the power semiconductor are un-limited.

The present invention further provides a manufacturing method of a power semiconductor. Since a first semiconductor substrate is carried on and combined with a fourth semiconductor substrate, the phenomenon of easily bending and frangibility caused by thinning the wafer thickness is avoided, and the backside implant process and the backside anneal process are smoothly proceeded.

In accordance with an aspect of the present invention, there is provided a manufacturing method of a power semiconductor. The manufacturing method includes steps of providing a first semiconductor substrate and a second semiconductor substrate, forming a metal oxide semiconductor layer on a first surface of the first semiconductor substrate, grinding a second surface of the first semiconductor substrate, forming a N-type buffer layer and a P-type injection layer on a third surface of the second semiconductor substrate through ion implanting, grinding a fourth surface of the second semiconductor substrate, and combining the second surface of the first semiconductor substrate with the third surface of the second semiconductor substrate for forming a third semiconductor substrate.

In accordance with another aspect of the present invention, there is provided a manufacturing method of a power semiconductor. The manufacturing method includes steps of providing a first semiconductor substrate and a second semiconductor substrate, forming a metal oxide semiconductor layer on a first surface of the first semiconductor substrate, grinding a second surface of the first semiconductor substrate, forming a N-type buffer layer and a P-type injection layer on a third surface of the second semiconductor substrate through ion implanting, grinding a fourth surface of the second semiconductor substrate, combining the second surface of the first semiconductor substrate with the third surface of the second semiconductor substrate for forming a third semiconductor substrate, combining a fifth surface of a fourth semiconductor substrate with the first surface of the first semiconductor substrate, grinding the fourth surface of the second semiconductor substrate, removing the fourth semiconductor substrate, and forming a collector metal layer on the fourth surface of the second semiconductor substrate.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
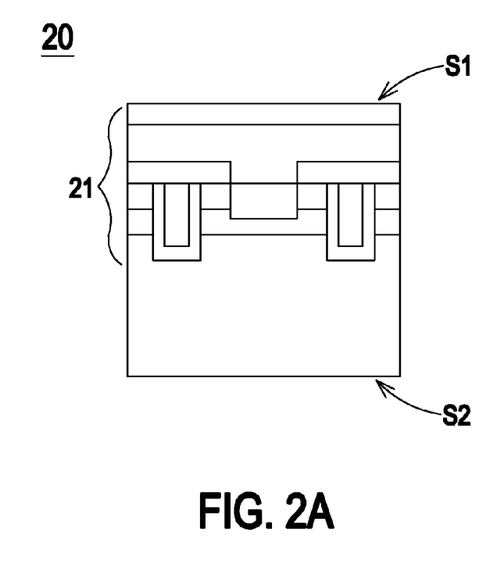
FIG. 2A to FIG. 2G schematically illustrate the structures corresponding to the steps of a manufacturing method of a power semiconductor according to an embodiment of the present invention.
Figure 2B:
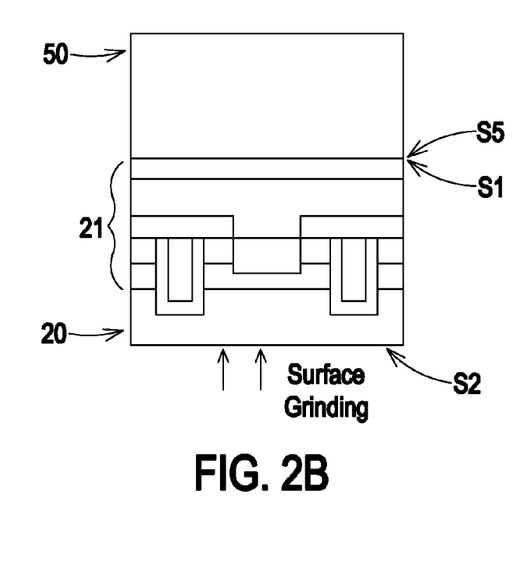
Figure 2C:
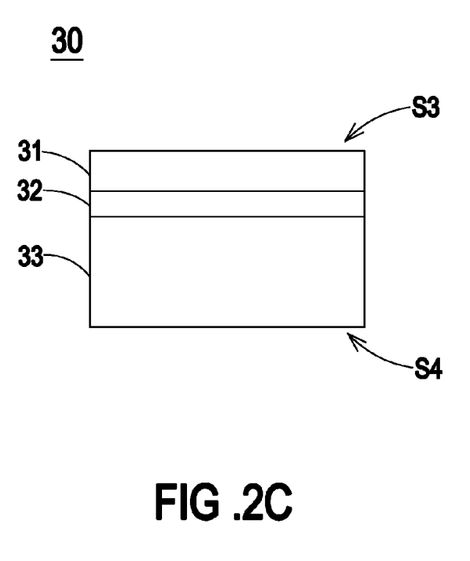

Please refer to FIG. 2A to FIG. 2G. FIG. 2A to FIG. 2G schematically illustrate the structures corresponding to the steps of a manufacturing method of a power semiconductor according to an embodiment of the present invention. A manufacturing method of a power semiconductor of the present invention includes steps as following. First, as shown in FIG. 2A and FIG. 2C, providing a first semiconductor substrate 20 and a second semiconductor substrate 30, among which the first semiconductor substrate 20 is not limited to a N-type semiconductor wafer made of a N-type floating zone substrate, and the first semiconductor substrate 20 has a first surface S1 and a second surface S2, which are for example the front surface and the back surface, but not limited thereto. The second semiconductor substrate 30 is not limited to a P-type semiconductor wafer and the second semiconductor substrate 30 has a third surface S3 and a fourth surface S4, which are for example the front surface and the back surface, but not limited thereto.

Figure 2D:
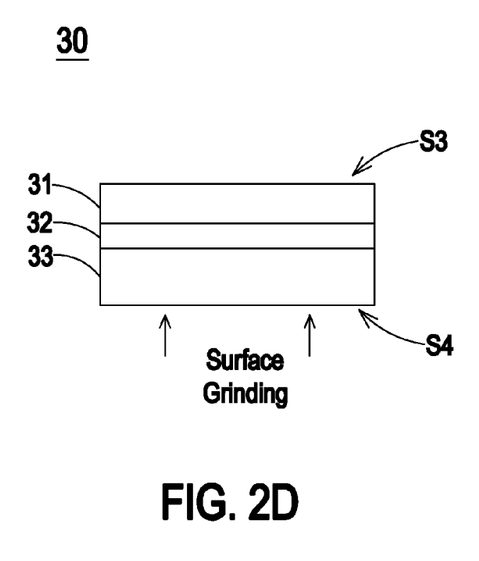
Figure 2E:
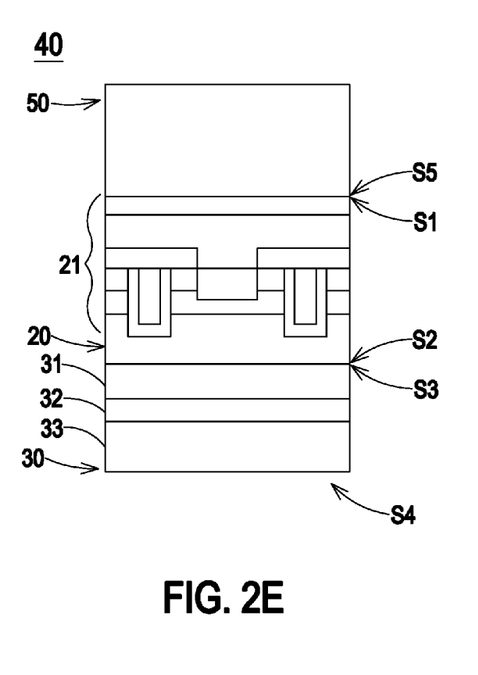

Next, as shown in FIG. 2A and FIG. 2B, forming a metal oxide semiconductor layer 21 on the first surface S1 of the first semiconductor substrate 20, and then grinding the second surface S2 of the first semiconductor substrate 20 (i.e. a backside grinding process of the first semiconductor substrate 20). Further, as shown in FIG. 2C, forming a N-type buffer layer 31 and a P-type injection layer 32 on the third surface S3 of the second semiconductor substrate 30 through ion implanting. Next, as shown in FIG. 2D, grinding the fourth surface S4 of the second semiconductor substrate 30 (i.e. a backside thinning process of the P-type substrate 33). At last, as shown in FIG. 2E, combining the second surface S2 of the first semiconductor substrate 20 with the third surface S3 of the second semiconductor substrate 30 for forming a third semiconductor substrate 40, among which the third semiconductor substrate 40 is a power semiconductor wafer, the first surface S1 of the first semiconductor substrate 20 is the front surface of the power semiconductor wafer, and the fourth surface S4 of the second semiconductor substrate 30 is the back surface of the power semiconductor wafer, but not limited thereto.

In some embodiments, the second surface S2 of the first semiconductor substrate 20 and the third surface S3 of the second semiconductor substrate 30 are combined through direct wafer bonding. Preferably, the combination of the second surface S2 of the first semiconductor substrate 20 and the third surface S3 of the second semiconductor substrate 30 is implemented by bonding the second surface S2 of the first semiconductor substrate 20 to the third surface S3 of the second semiconductor substrate 30 in high vacuum.

Figure 2F:
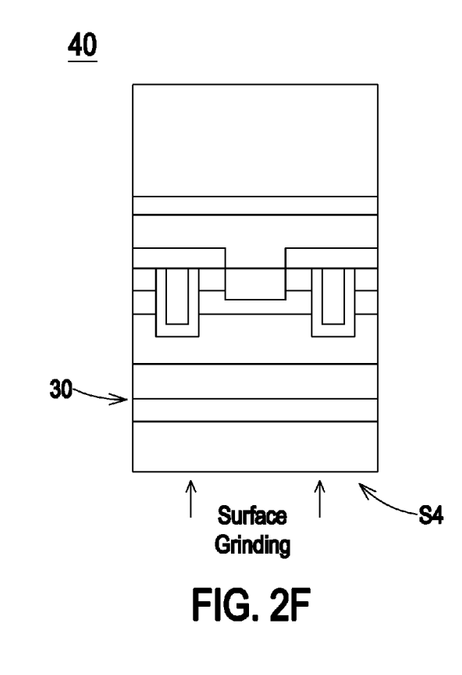

After combining the first semiconductor substrate 20 and the second semiconductor substrate 30, the third semiconductor substrate 40 is formed. The further step of the manufacturing method of the present invention is shown in FIG. 2F, grinding the back surface of the third semiconductor substrate 40, which is also the fourth surface S4 of the second semiconductor substrate 30 for removing the rest P-type substrate. Under this circumstance, the third semiconductor substrate 40 is grinded to a target thickness so that the third semiconductor substrate 40 can be proceeded the incoming processes.

In some embodiments, the P-type injection layer 32 is formed on the third surface S3, which is the front surface, of the second semiconductor substrate 30 through ion implanting at first for providing electron hole injection. By ion implanting P-type impurities like B11 on the third surface S3, the electron hole injection efficiency can be adjusted by changing the implant concentration. In addition, the N-type buffer layer 31 is then formed on the P-type injection layer 32 through ion implanting for buffering the electric field and adjusting the concentration of electron hole injection. By ion implanting N-type impurities like P31 or AS 75 on the P-type injection layer 32, the electron hole injection efficiency and the width of the depletion region can be adjusted by changing the implant concentration. As a result, the process flexibility is enhanced.

Certainly, in another embodiment, the P-type injection layer 32 and the N-type buffer layer 31 can be formed and implanted on the back surface of a wafer. The steps and the forming direction are opposite to the above-mentioned embodiment, but the concept is substantially the same, as which the present invention teaches. Moreover, the ion implanting process of forming the N-type buffer layer 31 and the P-type injection layer 32 on the third surface S3 of the second semiconductor substrate 30 can be synchronized with the process of forming the metal oxide semiconductor layer 21 on the first surface S1 of the first semiconductor substrate 20 mentioned above. That is, it is no limit that forming the metal oxide semiconductor layer 21 or forming the N-type buffer layer 31 and the P-type injection layer 32 at first. By respectively fabricating the first semiconductor substrate 20 and the second semiconductor substrate 30 and forming the third semiconductor substrate 40 by combining the first semiconductor substrate 20 and the second semiconductor substrate 30, the N-type buffer layer 31 and the P-type injection layer 32 are formed through ion implanting and high-temperature drive-in diffusion, which are not limited by the melting point of the metal. As a result, the process flexibility is enhanced, and the characteristics of the power semiconductor are un-limited.

In some embodiments, to avoid and solve the phenomenon of easily bending and frangibility caused by thinning the wafer thickness, a fourth semiconductor substrate is applied to the manufacturing method of the power semiconductor of the present invention for carrying. Please refer to FIG. 2B again. After the metal oxide semiconductor layer 21 is formed on the first surface S1 of the first semiconductor substrate 20, a fifth surface S5 of a fourth semiconductor substrate 50 (i.e. a carrying wafer) is combined with the first surface S1 of the first semiconductor substrate 20 through temporary wafer bonding. After combining the fifth surface S5 of the fourth semiconductor substrate 50 with the first surface S1 of the first semiconductor substrate 20, the further step of grinding the second surface S2 of the first semiconductor substrate 20 is proceeded. Since the first semiconductor substrate 20 is carried on and combined with the fourth semiconductor substrate 50, the phenomenon of easily bending and frangibility caused by thinning the wafer thickness is avoided, and the backside implant process and the backside anneal process are smoothly proceeded. In some embodiments, the fourth semiconductor substrate 50, which is the carrying wafer, may carry the first semiconductor substrate 20 during fabricating, especially during the combination of the first semiconductor substrate 20 and the second semiconductor substrate 30 and the surface grinding process as shown in FIG. 2F, for avoiding the bending or the fragmentation of the first semiconductor substrate 20 and the second semiconductor substrate 30.

Figure 2G:
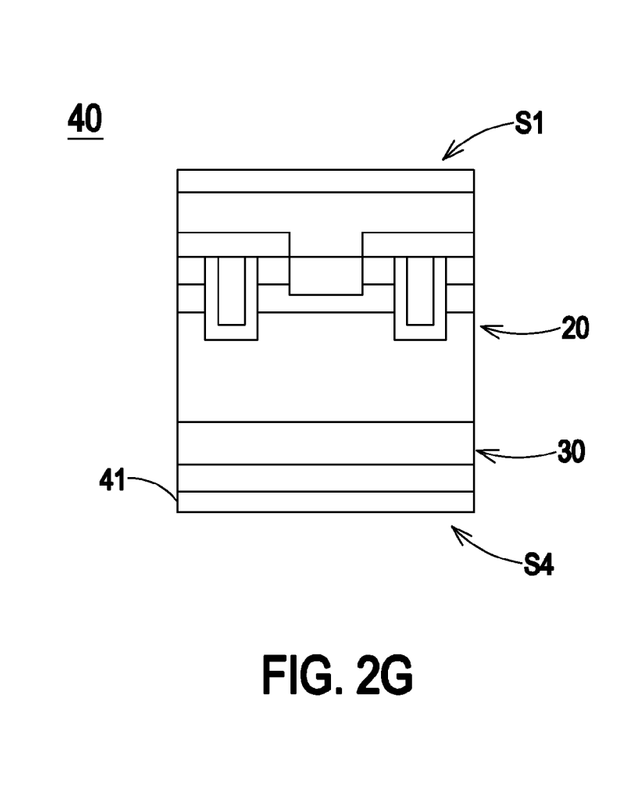

After the steps of combining the first semiconductor substrate 20 with the second semiconductor substrate 30 and grinding the fourth surface S4 of the second semiconductor substrate 30 (i.e. after the backside grinding process of the third semiconductor substrate 40), the further steps of removing the fourth semiconductor substrate 50 and forming a collector metal layer 41 on the fourth surface S4 of the second semiconductor substrate 30 of the manufacturing method of the present invention are shown in FIG. 2G.

Figure 3A:
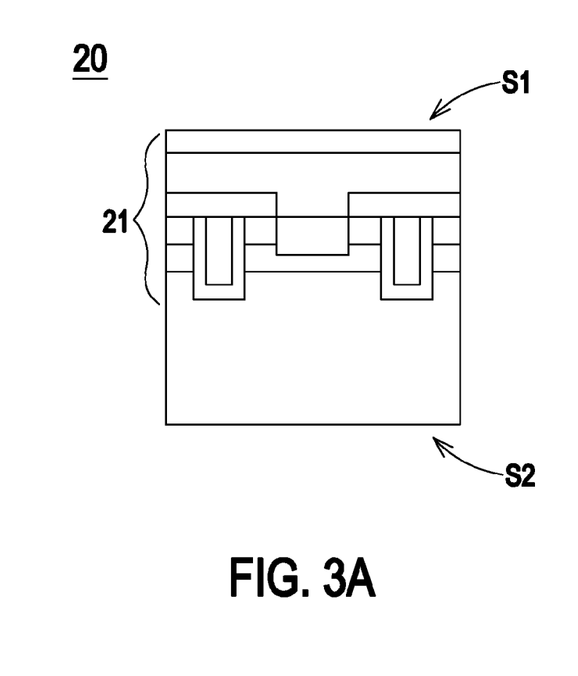
FIG. 3A to FIG. 3G schematically illustrate the structures corresponding to the steps of a manufacturing method of a power semiconductor according to another embodiment of the present invention.

Certainly, the fourth semiconductor substrate 50 can also be applied to another embodiments. Please refer to FIG. 3A to FIG. 3G. FIG. 3A to FIG. 3G schematically illustrate the structures corresponding to the steps of a manufacturing method of a power semiconductor according to another embodiment of the present invention. The manufacturing method of a power semiconductor includes steps as following. First of all, as shown in FIG. 3A and FIG. 3C, providing a first semiconductor substrate 20 and a second semiconductor substrate 30, among which the first semiconductor substrate 20 has a first surface S1 and a second surface S2 and the second semiconductor substrate 30 has a third surface S3 and a fourth surface S4.

Figure 3B:
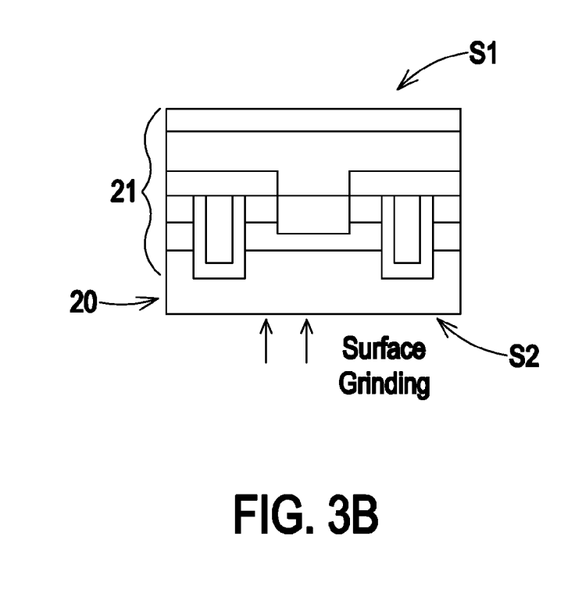
Figure 3C:
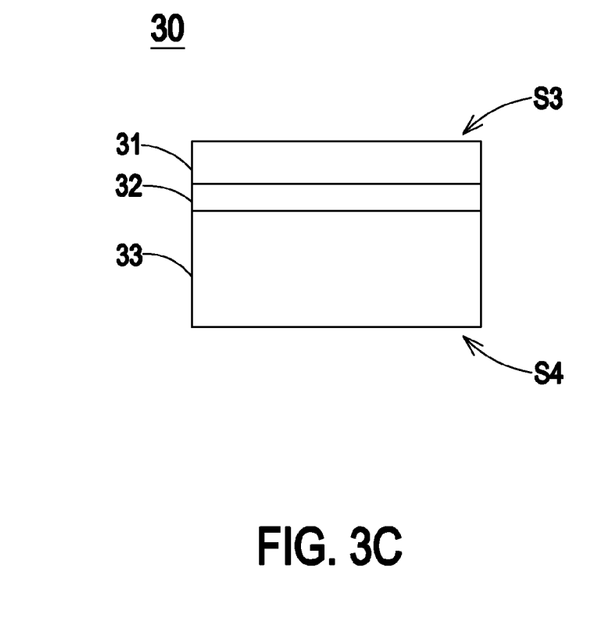
Figure 3D:
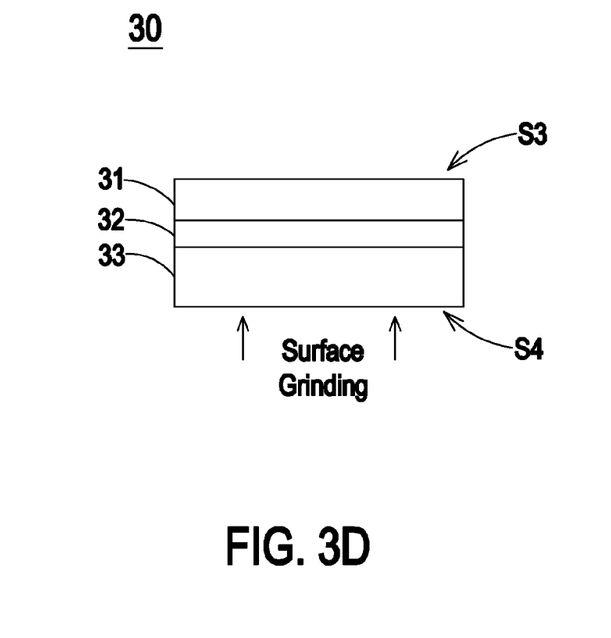
Figure 3E:
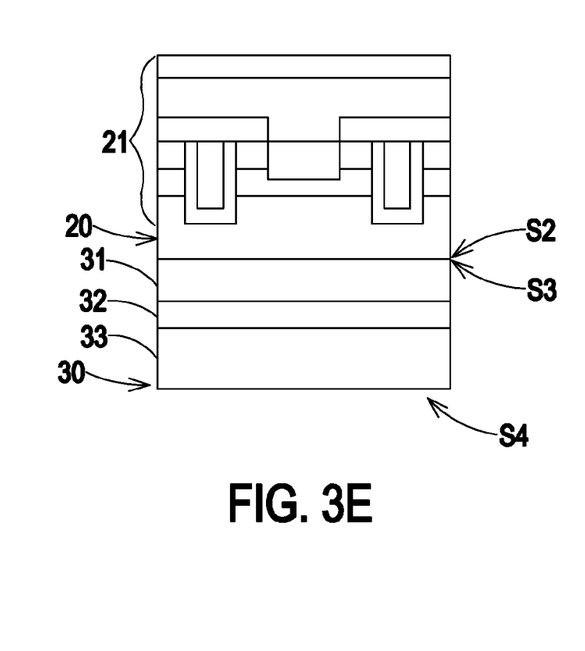
Figure 3F:
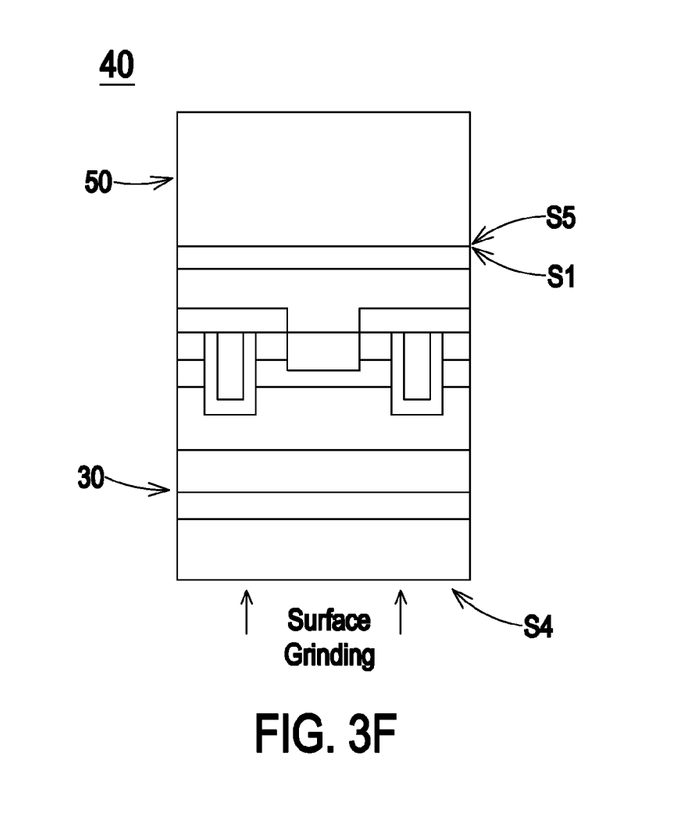
Figure 3G:
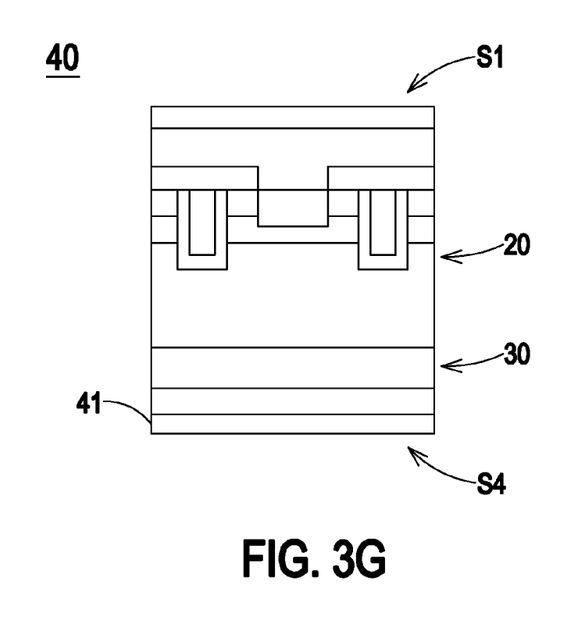

Next, as shown in FIG. 3A and FIG. 3B, forming a metal oxide semiconductor layer 21 on the first surface S1 of the first semiconductor substrate 20, and then grinding the second surface S2 of the first semiconductor substrate 20 (i.e. a backside grinding process of the first semiconductor substrate 20). Furthermore, as shown in FIG. 3C, forming a N-type buffer layer 31 and a P-type injection layer 32 on the third surface S3 of the second semiconductor substrate 30 through ion implanting. Next, as shown in FIG. 3D, grinding the fourth surface S4 of the second semiconductor substrate 30 (i.e. a backside thinning process of the P-type substrate 33). Further, as shown in FIG. 3E, combining the second surface S2 of the first semiconductor substrate 20 with the third surface S3 of the second semiconductor substrate 30 for forming a third semiconductor substrate 40. Next, as shown in FIG. 3F, combining a fifth surface S5 of a fourth semiconductor substrate 50, which is a carrying wafer, with the first surface S1 of the first semiconductor substrate 20 after the third semiconductor substrate 40 is formed, and then grinding the fourth surface S4 of the second semiconductor substrate 30 (i.e. a backside grinding process of the third semiconductor substrate 40). Finally, as shown in FIG. 3G, removing the fourth semiconductor substrate 50, and forming a collector metal layer 41 on the fourth surface S4 of the second semiconductor substrate 30, which is the back surface of the third semiconductor substrate 40. The power semiconductor is manufactured and the manufacturing method is done herein.

That is, the concept of carrying wafer, which is the fourth semiconductor substrate, is applied to different steps of the processes of the manufacturing method of the present invention, and advantages of avoiding the bending or the fragmentation of the first semiconductor substrate 20, the second semiconductor substrate 30 and/or the third semiconductor substrate 40 are achieved.

From the above description, the present invention provides a manufacturing method of a power semiconductor. By respectively fabricating a first semiconductor substrate and a second semiconductor substrate and forming a third semiconductor substrate by combining the first semiconductor substrate and the second semiconductor substrate, a N-type buffer layer and a P-type injection layer are formed through ion implanting and high-temperature drive-in diffusion, which are not limited by the melting point of the metal. Therefore, the process flexibility is enhanced, and the characteristics of the power semiconductor are un-limited. Meanwhile, since a first semiconductor substrate is carried on and combined with a fourth semiconductor substrate, the phenomenon of easily bending and frangibility caused by thinning the wafer thickness is avoided, and the backside implant process and the backside anneal process are smoothly proceeded.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a power semiconductor, comprising steps of:
   (a) providing a first semiconductor substrate and a second semiconductor substrate;
   (b) forming a metal oxide semiconductor layer on a first surface of said first semiconductor substrate;
   (c) grinding a second surface of said first semiconductor substrate;
   (d) forming a N-type buffer layer and a P-type injection layer on a third surface of said second semiconductor substrate through ion implanting;
   (e) grinding a fourth surface of said second semiconductor substrate; and
   (f) combining said second surface of said first semiconductor substrate with said third surface of said second semiconductor substrate for forming a third semiconductor substrate.

2. The manufacturing method according to claim 1, wherein said first semiconductor substrate is a N-type semiconductor wafer and said second semiconductor substrate is a P-type semiconductor wafer, and wherein said first surface and said second surface are respectively the front surface and the back surface of said N-type semiconductor wafer, and said third surface and said fourth surface are respectively the front surface and the back surface of said P-type semiconductor wafer.

3. The manufacturing method according to claim 1, wherein said third semiconductor substrate is a power semiconductor wafer, and wherein said first surface of said first semiconductor substrate is the front surface of said power semiconductor wafer, and said fourth surface of said second semiconductor substrate is the back surface of said power semiconductor wafer.

4. The manufacturing method according to claim 1, wherein said step (f) is implemented by bonding said second surface of said first semiconductor substrate to said third surface of said second semiconductor substrate in high vacuum.

5. The manufacturing method according to claim 1, wherein said step (d) further comprises steps of:
(d1) forming said P-type injection layer on said third surface of said second semiconductor substrate through ion implanting; and
(d2) forming said N-type buffer layer on said P-type injection layer through ion implanting.

6. The manufacturing method according to claim 1, further comprising a step, after said step (f), of: (g) grinding said fourth surface of said second semiconductor substrate.

7. The manufacturing method according to claim 6, further comprising a step, between said step (b) and said step (c), of: (b1) combining a fifth surface of a fourth semiconductor substrate with said first surface of said first semiconductor substrate.

8. The manufacturing method according to claim 7, further comprising steps, after said step (g), of:
(h) removing said fourth semiconductor substrate; and
(i) forming a collector metal layer on said fourth surface of said second semiconductor substrate.

9. The manufacturing method according to claim 6, further comprising a step, between said step (f) and said step (g), of:
(f1) combining a fifth surface of a fourth semiconductor substrate with said first surface of said first semiconductor substrate.

10. The manufacturing method according to claim 9, further comprising steps, after said step (g), of:
(h) removing said fourth semiconductor substrate; and
(i) forming a collector metal layer on said fourth surface of said second semiconductor substrate.

11. A manufacturing method of a power semiconductor, comprising steps of:
providing a first semiconductor substrate and a second semiconductor substrate;
forming a metal oxide semiconductor layer on a first surface of said first semiconductor substrate;
grinding a second surface of said first semiconductor substrate;
forming a N-type buffer layer and a P-type injection layer on a third surface of said second semiconductor substrate through ion implanting;
grinding a fourth surface of said second semiconductor substrate;
combining said second surface of said first semiconductor substrate with said third surface of said second semiconductor substrate for forming a third semiconductor substrate;
combining a fifth surface of a fourth semiconductor substrate with said first surface of said first semiconductor substrate;
grinding said fourth surface of said second semiconductor substrate;
removing said fourth semiconductor substrate; and
forming a collector metal layer on said fourth surface of said second semiconductor substrate.

* * * * *